(12) United States Patent
Yagi

(10) Patent No.: US 9,603,293 B2
(45) Date of Patent: Mar. 21, 2017

(54) NOISE-REDUCING SHIELDED CABLE

(71) Applicant: YAZAKI CORPORATION, Tokyo (JP)

(72) Inventor: Daisuke Yagi, Shizuoka (JP)

(73) Assignee: YAZAKI CORPORATION, Tokyo (JP)

( * ) Notice: Subject to any disclaimer, the term of this patent is extended or adjusted under 35 U.S.C. 154(b) by 103 days.

(21) Appl. No.: 14/762,342

(22) PCT Filed: Jan. 22, 2014

(86) PCT No.: PCT/JP2014/051274
§ 371 (c)(1),
(2) Date: Jul. 21, 2015

(87) PCT Pub. No.: WO2014/115773
PCT Pub. Date: Jul. 31, 2014

(65) Prior Publication Data
US 2015/0366111 A1 Dec. 17, 2015

(30) Foreign Application Priority Data

Jan. 23, 2013 (JP) .................. 2013-010471

(51) Int. Cl.
H04B 3/28 (2006.01)
H05K 9/00 (2006.01)
H02M 1/44 (2007.01)
H02M 7/00 (2006.01)

(52) U.S. Cl.
CPC ............ *H05K 9/0071* (2013.01); *H02M 1/44* (2013.01); *H02M 7/003* (2013.01); *H05K 9/0064* (2013.01); *H05K 9/0098* (2013.01)

(58) Field of Classification Search
CPC .... H05K 9/0071; H05K 9/0064; H05K 9/098; H02M 1/44; H02M 7/003
USPC .......................................................... 333/12
See application file for complete search history.

(56) References Cited

U.S. PATENT DOCUMENTS

| 1,773,370 | A | * | 8/1930 | Milnor | ..................... | H04B 3/30 |
| | | | | | | 178/63 R |
| 4,264,940 | A | * | 4/1981 | Castle | ..................... | H02H 9/04 |
| | | | | | | 333/12 |
| 2011/0050135 | A1 | | 3/2011 | Higuchi et al. | | |

FOREIGN PATENT DOCUMENTS

| CN | 1834673 A | 9/2006 |
| CN | 101884158 A | 11/2010 |
| JP | 7-304327 A | 11/1995 |
| JP | 8-79190 A | 3/1996 |
| JP | 11-18487 A | 1/1999 |
| JP | 2001-69762 A | 3/2001 |

(Continued)

OTHER PUBLICATIONS

International Search Report for PCT/JP2014/051274 dated May 13, 2014.

(Continued)

*Primary Examiner* — Robert Pascal
*Assistant Examiner* — Kimberly Glenn
(74) *Attorney, Agent, or Firm* — Kenealy Vaidya LLP

(57) ABSTRACT

As a noise-reducing shielded cable according to the present invention, provided is a shielded cable having an inverter (10), a motor (30), a cable (20) connecting the inverter and the motor with each other, a shield layer (40) covering the cable, and two ground wires (50) grounding both ends of the shield layer.

4 Claims, 4 Drawing Sheets

(56) References Cited

FOREIGN PATENT DOCUMENTS

| JP | 2003-219655 A | 7/2003 |
| JP | 2006-80215 A | 3/2006 |
| JP | 2010-136564 A | 6/2010 |
| JP | 2012-110092 A | 6/2012 |

OTHER PUBLICATIONS

English language Written Opinion of the International Search Report for PCT/JP2014/051274 dated May 13, 2014.
Chinese Office Action for the related Chinese Patent Application No. 201480005864.0 dated Oct. 19, 2016.

* cited by examiner

NOISE-REDUCING SHIELDED CABLE

TECHNICAL FIELD

The present invention relates to a shielded cable, in particular, a noise-reducing shielded cable having a noise-reducing function for reducing switching noise or inductive load surge occurring due to a switching operation of a switching circuit.

BACKGROUND ART

<Electric Vehicles and Hybrid Vehicles>

In electric vehicles and hybrid vehicles, an inverter is used for converting a DC voltage of a battery to an AC voltage, and variable speed control is performed on a motor by means of an AC output from the inverter.

A pulse-width modulation (PWM) type inverter is used as the inverter. In the pulse-width modulation (PMW) type inverter, a sine-wave command is generated as a voltage command, and the value of a triangular wave carrier is compared with the value of the sine-wave command. Based on a pulse signal thus obtained, a gate signal is generated to operate a switching device. However, the AC voltage output from the inverter does not have a perfect sinusoidal waveform but has a shape in which rectangular waves with different widths are piled up continuously. Therefore, in a corner part of each rectangular wave where a voltage change rate changes suddenly, a surge voltage may be generated due to resonance, reflection or the like in a line between the inverter and the motor.

There are two typical methods for addressing a surge voltage in the background art, that is, (1) a method using a filter (see Patent Documents 1 to 3) and (2) an electromagnetic shielding method.

PRIOR ART DOCUMENTS

Patent Documents

Patent Document 1: JP2003-219655A
Patent Document 2: JP2001-069762A
Patent Document 3: JP2010-136564A

SUMMARY OF INVENTION

Problems to be Solved by Invention

<Method Using Filter>

FIG. 7 shows a background-art technique in which a filter is used for protecting a motor from a surge voltage and further reducing noise.

In the circuit shown in FIG. 7, a three-phase output from an inverter 10 is sent to a motor 30 through a cable 20. An inductor (induction coil) L is inserted into each phase of the cable 20. A resistor R and a capacitor (capacitance) C are connected in series to either the front side (inverter 10 side) or the rear side (motor side) of the inductor L so as to form a series connection circuit serving as one arm. End portions of a star connection of three arms formed thus are connected to the phases of the cable 20 respectively. A neutral point of the star connection is grounded.

In this manner, a surge voltage is suppressed by a filter 60 constituted by the inductors L, the resistors R and the capacitors C (see Patent Documents 1 to 3).

<Problem>

When the circuit shown in FIG. 7 is used for application with a large circuit current, electric power appearing in the inductors L or the resistors R constituting the filter increases to increase the size of apparatus and to deteriorate efficiency due to a loss in the resistors R.

<Electromagnetic Shielding Method>

FIG. 8 shows a background-art technique in which a wire and connectors shielded electromagnetically are used to reduce noise released from a system including an inverter, a motor and a cable.

In the structure shown in FIG. 8, a three-phase output from an inverter 10 is sent to a motor 30 through a high shielded wire 70. High shielded connectors 80 make connection between the inverter 10 and the high shielded wire 70 and between the high shielded wire 70 and the motor 30.

By use of the high shielded wire 70 and the high shielded connectors 80 each having such an electromagnetic shielding structure high in shielding performance, it is possible to reduce radiation or induction (electromagnetic interference) of high-voltage noise to the surroundings from the cable connecting the inverter 10 and the motor 30.

<Problem>

In the structure shown in FIG. 8, a large number of metal shielding members are used in the shielded wire and the connectors to thereby increase the size, the mass and the cost. However, noise passing through a GND plane cannot be reduced satisfactorily.

The present invention has been made in view of the aforementioned circumstances. An object of the invention is to provide a noise-reducing shielded cable capable of reducing the size, the mass and the cost of apparatus and capable of sufficiently addressing noise passing through a GND plane without reducing efficiency.

Means for Solving the Problem

In order to achieve the object described above, noise-reducing shielded cables according to the present invention are characterized as in the following (1) to (4).

(1) A noise-reducing shielded cable including a cable that connects an inverter and a motor with each other, a shield layer covering the cable, a first ground wire that grounds one of both ends of the shield layer, and a second ground wire that grounds the other of the both ends of the shield layer, wherein:

a capacitor of capacitance $Ca1$ and an inductor of inductance $La1$ are provided on the first ground wire;

a capacitor of capacitance $Ca2$ and an inductor of inductance $La2$ are provided on the second ground wire; and when capacitance between a core wire of the cable and the shield layer is designated as $C0$ and a fundamental frequency of a surge voltage to be suppressed is designated as $f1$, Expression (1) is satisfied.

$$f1 = 1/[2\pi \times (L \times C)^{1/2}] \qquad \text{Expression (1)}$$

where $L = La1$ and $C = C0 \times Ca1/(C0 + Ca1)$ or $L = La2$ and $C = C0 \times Ca2/(C0 + Ca2)$ (2) A noise-reducing shielded cable including a cable that connects an inverter and a motor with each other, a shield layer covering the cable, and a ground wire that grounds one end of the shield layer, wherein:

a capacitor of capacitance $Ca3$ and an inductor of inductance $La3$ are provided on the ground wire; and when capacitance between a core wire of the cable and the shield layer is designated as C0 and a fundamental frequency of a surge voltage to be suppressed is designated as f1, Expression (2) is satisfied.

$$f1=1/[\pi \times (L \times C)^{1/2}]$$ Expression (2)

where $L=La3$ and $C=C0 \times Ca3/(C0+Ca3)$ (3) A noise-reducing shielded cable including a cable that connects an inverter and a motor with each other, a shield layer covering the cable, and a ground wire that grounds one end of the shield layer, wherein:
an inductor of inductance Lb is provided on the ground wire; and
when capacitance between a core wire of the cable and the shield layer is designated as C0 and a fundamental frequency of a surge voltage to be suppressed is designated as f1, Expression (3) is satisfied.

$$f1=1/[2\pi \times (Lb \times C0)^{1/2}]$$ Expression (3)

(4) A noise-reducing shielded cable including a cable that connects an inverter and a motor with each other, a shield layer covering the cable, and a ground wire that grounds one end of the shield layer, wherein:
a ground wire of self-inductance Lc is used as the ground wire; and
when capacitance between a core wire of the cable and the shield layer is designated as C0 and a fundamental frequency of a surge voltage to be suppressed is designated as f1, Expression (4) is satisfied.

$$f1=1/[2\pi \times (Lc \times C0)^{1/2}]$$ Expression (4)

According to the invention described in (1), the inductance La1 and the capacitance Ca1 or the inductance La2 and the capacitance Ca2 are selected to satisfy Expression (1) so that, if a surge voltage of the frequency f1 to be suppressed is generated, the surge voltage can flow to the ground side through the ground wire 50. Thus, a noise-reducing shielded cable that hardly affects the motor side or the ambient environment can be obtained substantially without changing the size, the mass and the cost of apparatus.

According to the invention described in (2), only the inductance La3 and the capacitance Ca3 are selected to satisfy Expression (2) so that, if a surge voltage of the frequency f1 to be suppressed is generated, the surge voltage can flow to the ground side through the ground wire 50. Thus, a noise-reducing shielded cable that hardly affects the motor side or the ambient environment can be obtained substantially without changing the size, the mass and the cost of apparatus.

According to the invention described in (3), only the inductance Lb is selected to satisfy Expression (3) so that, if a surge voltage of the frequency f1 to be suppressed is generated, the surge voltage can flow to the ground side through the ground wire 50. Thus, a noise-reducing shielded cable that hardly affects the motor side or the ambient environment can be obtained substantially without changing the size, the mass and the cost of apparatus.

According to the invention described in (4), a ground wire 50 of the self-inductance Lc is selected to satisfy Expression (4) so that, if a surge voltage of the frequency f1 to be suppressed is generated, the surge voltage can flow to the ground side through the ground wire 51. Thus, a noise-reducing shielded cable that hardly affects the motor side or the ambient environment can be obtained substantially without changing the size, the mass and the cost of apparatus.

Advantage of the Invention

According to the invention, it is possible to provide a noise-reducing shielded cable capable of reducing the size, the mass and the cost of apparatus and capable of sufficiently addressing noise passing through a GND plane without reducing efficiency.

EMBODIMENTS OF INVENTION

Noise-reducing shielded cables according to Embodiments 1 to 4 of the invention will be described below with reference to FIGS. 1 to 6.

Embodiment 1

Figure 1:
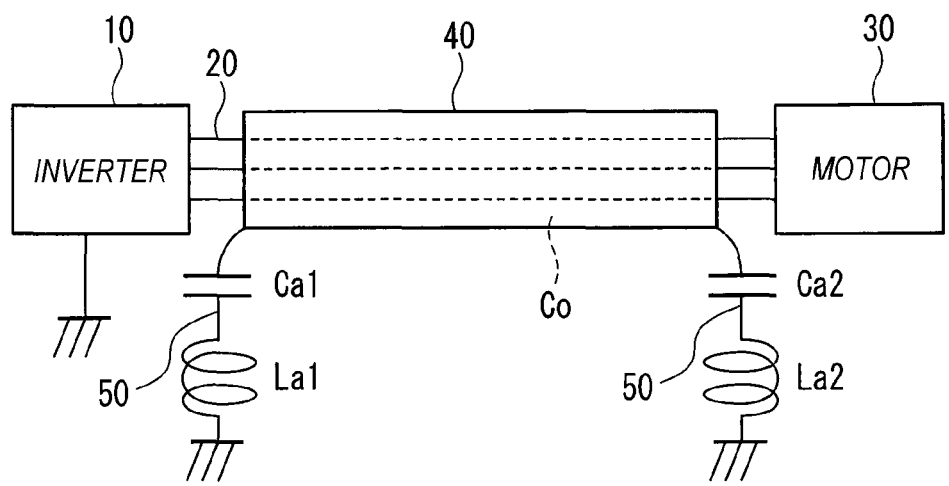
FIG. 1 is a block diagram of a noise-reducing shielded cable according to Embodiment 1 of the invention.

As shown in FIG. 1, a three-phase output from an inverter 10 is sent to a motor 30 through a cable 20. Three cables of the cable 20 between the inverter 10 and the motor 30 are covered with a shield layer 40.

The noise-reducing shielded cable according to Embodiment 1 is characterized in that a series circuit of a capacitor Ca1 and an inductor La1 is inserted in a ground wire 50 grounding one end of the shield layer 40, and a series circuit of a capacitor Ca2 and an inductor La2 is inserted in a ground wire 50 grounding the other end of the shield layer 40.

<Shield Layer 40>
The shield layer 40 includes three core wires through which a signal is transmitted, and a shield layer that surrounds the three core wires. The shield layer 40 is characterized in that capacitance C0 is provided between the core wires and the shield layer.

Figure 8:
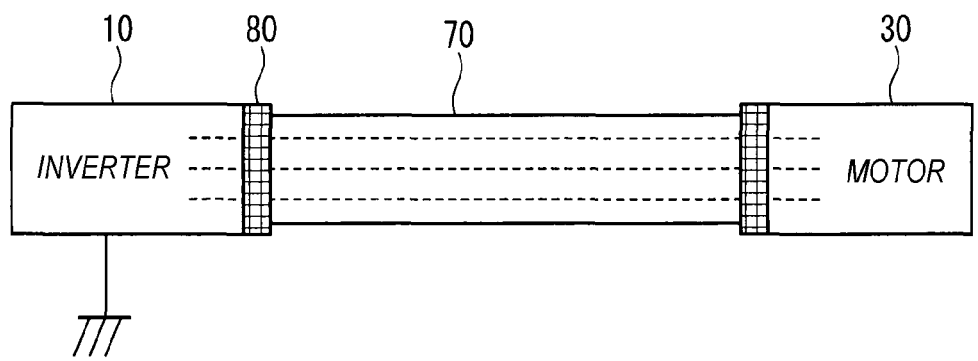
FIG. 8 shows a background-art noise-reducing technique in which a wire and connectors shielded electromagnetically are used for reducing noise released from a system including an inverter, a motor and a cable.

As is understood from FIG. 1, a rigorous shield structure as shown in FIG. 8 does not have to be used between the inverter 10 and the shield layer 40 or between the motor 30 and the shield layer 40 (of course, such a shield structure may be used).

<Two Systems of Series Circuits of Capacitors Ca and Inductors La>

When the capacitance of the capacitor Ca1, the capacitance of the capacitor Ca2, the inductance of the inductor La1 and the inductance of the inductor La2 are designated as Ca1, Ca2, La1 and La2 respectively and a fundamental frequency of a surge voltage to be suppressed is designated as f1, the inductance La1 and the capacitance Ca1 or the inductance La2 and the capacitance Ca2 may be selected to satisfy Expression (1):

$$f1=1/[2\pi \times (L \times C)^{1/2}] \qquad \text{Expression (1)}$$

wherein $L=La1$ and $C=C0 \times Ca1/(C0+Ca1)$ or $L=La2$ and $C=C0 \times Ca2/(C0+Ca2)$.

In this manner, if a surge voltage of the frequency f1 to be suppressed is generated, the surge voltage can flow to the ground side through the ground wire 50. Thus, it is possible to avoid influence on the motor side or the ambient environment. This point will be explained below with reference to FIG. 5 and FIG. 6.

<Impedance Change in Ground Wire Depending on Frequency>

Figure 5:
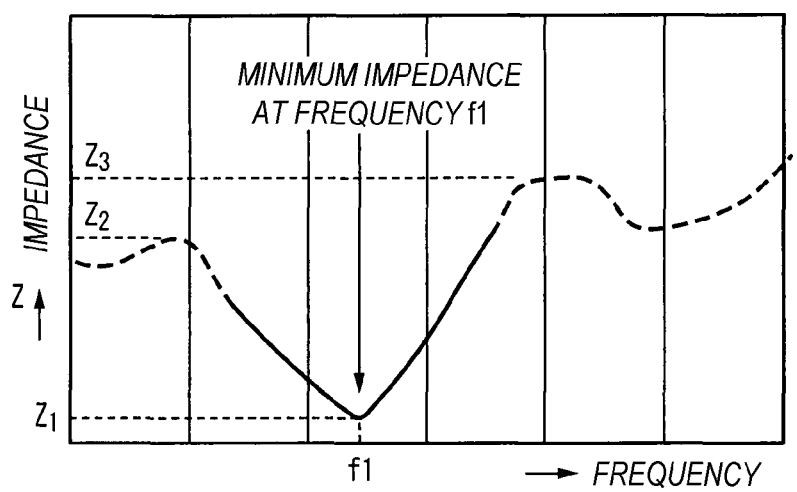
FIG. 5 is a graph showing a frequency versus impedance characteristic between a core wire and a GND (ground) in a noise-reducing shielded cable according to the invention.

FIG. 5 is a graph showing a frequency versus impedance characteristic between a core wire and a GND (ground) in a noise-reducing shielded cable according to the invention. The ordinate designates impedance Z of a ground wire 50 as a whole, and the abscissa designates a change in frequency f. In FIG. 5, with increase of the frequency f, the impedance Z decreases gradually from a value Z2 and reaches a minimum value Z1 at a frequency f1. After that, when the frequency f increases, the impedance Z increases up to a value Z3.

That is, when a surge voltage of the frequency f1 is generated, the impedance Z of the ground wire 50 takes the minimum value so that almost the surge voltage can flow to the ground side. This can be confirmed on FIG. 6, which is a graph showing the frequency versus signal passing characteristic, as follows.

Figure 6:
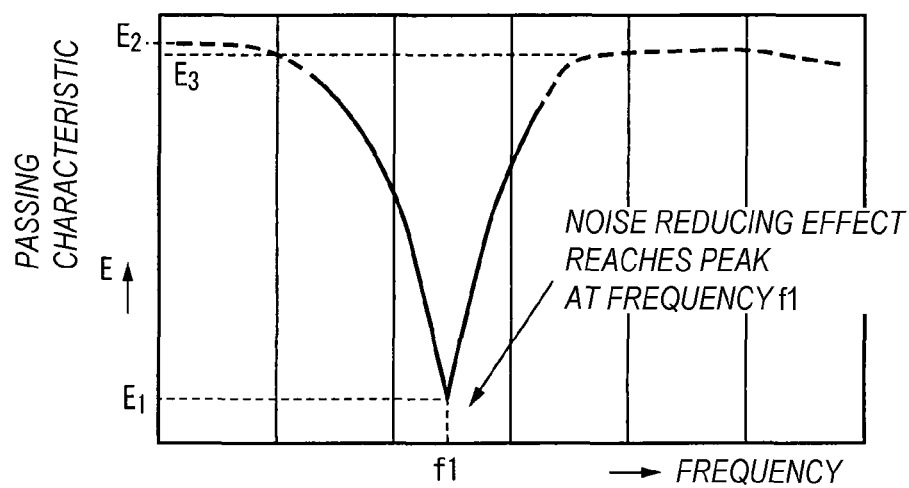
FIG. 6 is a graph showing a frequency versus signal passing characteristic between the core wire and the GND (ground) in the noise-reducing shielded cable according to the invention.
Figure 7:
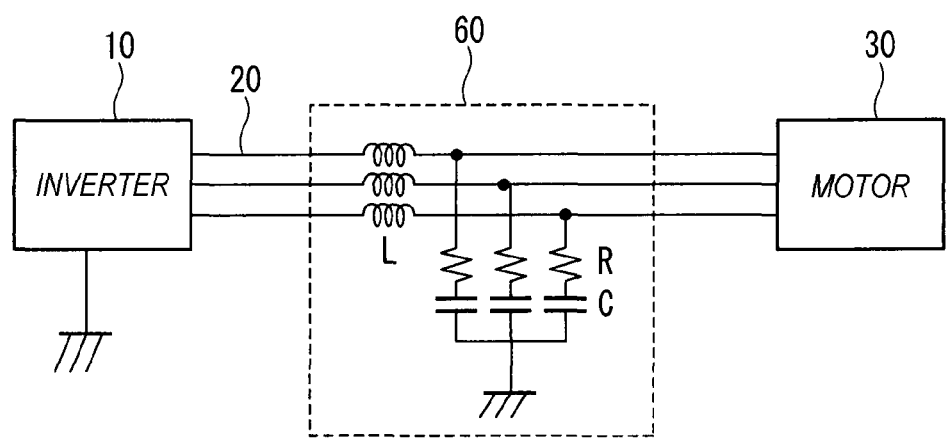
FIG. 7 shows a background-art surge countermeasure technique using a filter.

<Passing Characteristic of Shielded Cable Depending on Frequency>FIG. 6 is a graph showing a frequency versus signal passing characteristic between the core wire and the GND (ground) in the noise-reducing shielded cable according to the invention. The ordinate designates a passing characteristic of the shielded cable, and the abscissa designates a change in the frequency f. In FIG. 6, with increase of the frequency f, the passing characteristic E decreases gradually from a value E2 and reaches a minimum value E1 at the frequency f1. After that, when the frequency f increases, the passing characteristic E increases up to a value E3.

That is, when a surge voltage of the frequency f1 is generated, the passing characteristic E of the shielded cable takes the minimum value so that the surge voltage can hardly pass. Thus, the noise suppression effect reaches a peak at the frequency f1.

<Conclusion>

The inductance La1 or La2 and the capacitance Ca1 or Ca2 are selected to satisfy Expression (1) so that, if a surge voltage of the frequency f1 to be suppressed is generated, the surge voltage can flow to the ground side through the ground wire 50. Thus, a noise-reducing shielded cable that hardly affects the motor side or the ambient environment can be obtained substantially without changing the size, the mass and the cost of apparatus.

Embodiment 2

Figure 2:
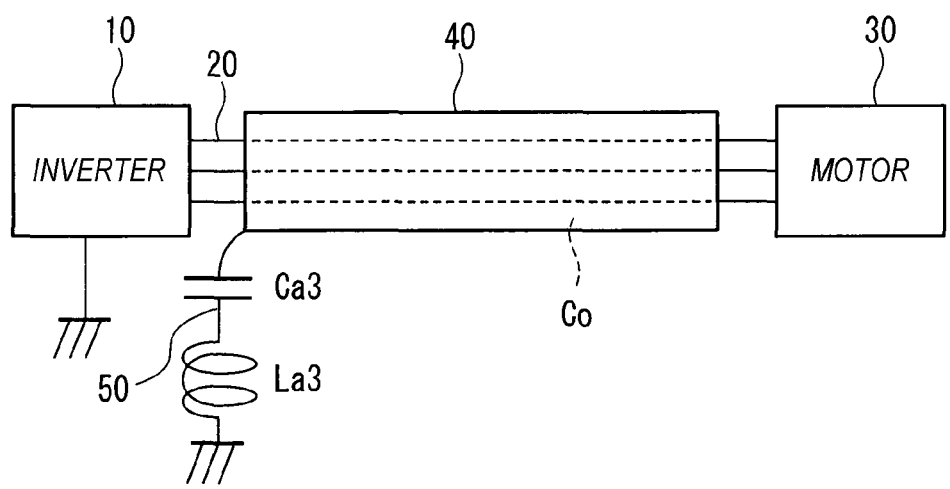
FIG. 2 is a block diagram of a noise-reducing shielded cable according to Embodiment 2 of the invention.

FIG. 2 is a block diagram of a noise-reducing shielded cable according to Embodiment 2 of the invention.

In FIG. 2, a three-phase output from an inverter 10 is sent to a motor 30 through a cable 20. Three cables of the cable 20 between the inverter 10 and the motor 30 are covered with a shield layer 40.

The noise-reducing shielded cable according to Embodiment 2 is characterized in that a series circuit of a capacitor Ca3 and an inductor La3 is inserted in a ground wire 50 grounding only one side of the shield layer 40.

<Shield Layer 40>

The shield layer 40 includes three core wires through which a signal is transmitted, and a shield layer that surrounds the three core wires. The shield layer 40 is characterized in that capacitance C0 is provided between the core wires and the shield layer.

As is understood from FIG. 2, a rigorous shield structure as shown in FIG. 8 does not have to be used between the inverter 10 and the shield layer 40 or between the motor 30 and the shield layer 40 (of course, such a shield structure may be used).

<Series Circuit of Capacitor Ca and Inductor La>

When the capacitance of the capacitor Ca3 and the inductance of the inductor La3 are designated as Ca3 and La3 respectively and a fundamental frequency of a surge voltage to be suppressed is designated as f1, the inductance La3 and the capacitance Ca3 may be selected to satisfy Expression (2):

$$f1=1/[2\pi \times (L \times C)^{1/2}] \qquad \text{Expression (2)}$$

wherein $L=La3$ and $C=C0 \times Ca3/(C0+Ca3)$.

In this manner, if a surge voltage of the frequency f1 to be suppressed is generated, the surge voltage can flow to the ground side through the ground wire 50 as described by the graphs shown in FIG. 5 and FIG. 6. Thus, it is possible to avoid influence on the motor side or the ambient environment.

<Conclusion>

The inductance La3 and the capacitance Ca3 are selected to satisfy Expression (2) so that, if a surge voltage of the frequency f1 to be suppressed is generated, the surge voltage can flow to the ground side through the ground wire 50. Thus, a noise-reducing shielded cable that hardly affects the motor side or the ambient environment can be obtained substantially without changing the size, the mass and the cost of apparatus.

Embodiment 3

Figure 3:
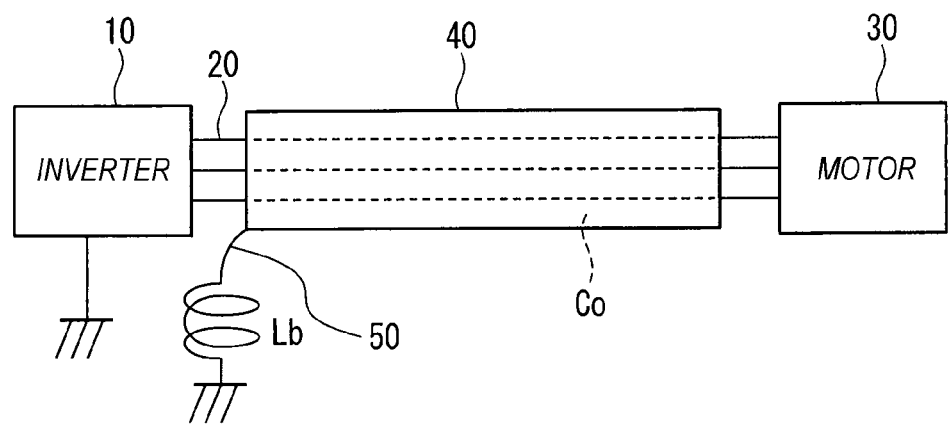
FIG. 3 is a block diagram of a noise-reducing shielded cable according to Embodiment 3 of the invention.

FIG. 3 is a block diagram of a noise-reducing shielded cable according to Embodiment 3 of the invention.

In FIG. 3, a three-phase output from an inverter 10 is sent to a motor 30 through a cable 20. Three cables of the cable 20 between the inverter 10 and the motor 30 are covered with a shield layer 40.

The noise-reducing shielded cable according to Embodiment 3 is characterized in that only an inductor Lb is inserted in a ground wire 50 grounding only one side of the shield layer 40.

<Shield Layer 40>

The shield layer 40 includes three core wires through which a signal is transmitted, and a shield layer that surrounds the three core wires. The shield layer 40 is characterized in that capacitance C0 is provided between the core wires and the shield layer.

As is understood from FIG. 2, a rigorous shield structure as shown in FIG. 8 does not have to be used between the inverter 10 and the shield layer 40 or between the motor 30 and the shield layer 40 (of course, such a shield structure may be used).

<Inductor Lb>

When the inductance of the inductor Lb is designated as Lb and a fundamental frequency of a surge voltage to be suppressed is designated as f1, the inductance Lb may be selected to satisfy Expression (3):

$$f1=1/[2\pi \times (Lb \times C0)^{1/2}] \quad \text{Expression (3)}$$

In this manner, if a surge voltage of the frequency f1 to be suppressed is generated, the surge voltage can flow to the ground side through the ground wire 50 as described by the graphs shown in FIG. 5 and FIG. 6. Thus, it is possible to avoid influence on the motor side or the ambient environment.

<Conclusion>

The inductance Lb3 is selected to satisfy Expression (3) so that, if a surge voltage of the frequency f1 to be suppressed is generated, the surge voltage can flow to the ground side through the ground wire 50. Thus, a noise-reducing shielded cable that hardly affects the motor side or the ambient environment can be obtained substantially without changing the size, the mass and the cost of apparatus.

Embodiment 4

Figure 4:
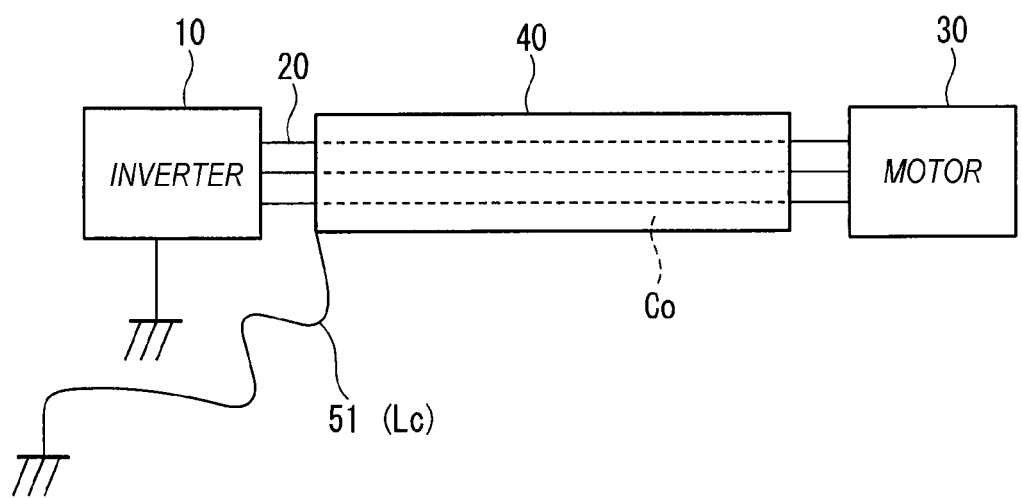
FIG. 4 is a block diagram of a noise-reducing shielded cable according to Embodiment 4 of the invention.

FIG. 4 is a block diagram of a noise-reducing shielded cable according to Embodiment 4 of the invention.

In FIG. 4, a three-phase output from an inverter 10 is sent to a motor 30 through a cable 20. Three cables of the cable 20 between the inverter 10 and the motor 30 are covered with a shield layer 40.

The noise-reducing shielded cable according to Embodiment 4 is characterized in that a ground wire 51 of self-inductance Lc is used as a ground wire grounding only one side of the shield layer 40.

<Shield Layer 40>

The shield layer 40 includes three core wires through which a signal is transmitted, and a shield layer that surrounds the three core wires. The shield layer 40 is characterized in that capacitance C0 is provided between the core wires and the shield layer.

As is understood from FIG. 2, a rigorous shield structure as shown in FIG. 8 does not have to be used between the inverter 10 and the shield layer 40 or between the motor 30 and the shield layer 40 (of course, such a shield structure may be used).

<Ground Wire 51 of Self-Inductance Lc>

When the self-inductance of the ground wire 51 is designated as Lc and a fundamental frequency of a surge voltage to be suppressed is designated as f1, a ground wire Lc is selected to have self-inductance satisfying Expression (4):

$$f1=1/[2\pi \times (Lc \times C0)^{1/2}] \quad \text{Expression (4)}$$

In this manner, if a surge voltage of the frequency f1 to be suppressed is generated, the surge voltage can flow to the ground side through the ground wire 51 as described by the graphs shown in FIG. 5 and FIG. 6. Thus, it is possible to avoid influence on the motor side or the ambient environment.

<Conclusion>

The ground wire Lc is selected to have self-inductance satisfying Expression (4) so that, if a surge voltage of the frequency f1 to be suppressed is generated, the surge voltage can flow to the ground side through the ground wire 51. Thus, a noise-reducing shielded cable that hardly affects the motor side or the ambient environment can be obtained substantially without changing the size, the mass and the cost of apparatus.

Here, the characteristics of the aforementioned embodiments of the noise-reducing shielded cables according to the present invention will be briefly summarized and listed in the following [1] to [4].

[1] A noise-reducing shielded cable including a cable (20) that connects an inverter (10) and a motor (30) with each other, a shield layer (40) covering the cable, a first ground wire (50) that grounds one of both ends of the shield layer, and a second ground wire (50) that grounds the other of the both ends of the shield layer, wherein a capacitor of capacitance Ca1 and an inductor of inductance La1 are provided on the first ground wire, wherein a capacitor of capacitance Ca2 and an inductor of inductance La2 are provided on the second ground wire, and wherein, with capacitance between a core wire of the cable and the shield layer being C0 and a fundamental frequency of a surge voltage to be suppressed being f1, Expression (1) is satisfied, $$f1=1/[2\pi \times (L \times C)^{1/2}] \quad \text{Expression (1)}$$

wherein $L=La1$ and $C=C0 \times Ca1/(C0+Ca1)$ or $L=La2$ and $C=C0 \times Ca2/(C0+Ca2)$.

[2] A noise-reducing shielded cable including a cable (20) that connects an inverter (10) and a motor (30) with each other, a shield layer (40) covering the cable, and a ground wire (50) that grounds one end of the shield layer, wherein a capacitor of capacitance Ca3 and an inductor of inductance La3 are provided on the ground wire, and wherein, with capacitance between a core wire of the cable and the shield layer being C0 and a fundamental frequency of a surge voltage to be suppressed being f1, Expression (2) is satisfied, $$f1=1/[2\pi \times (L \times C)^{1/2}] \quad \text{Expression (2)}$$

wherein $L=La3$ and $C=C0 \times Ca3/(C0+Ca3)$.

[3] A noise-reducing shielded cable including a cable (20) that connects an inverter (10) and a motor (30) with each other, a shield layer (40) covering the cable, and a ground wire (50) that grounds one end of the shield layer, wherein an inductor of inductance Lb is provided on the ground wire, and wherein, with capacitance between a core wire of the cable and the shield layer being C0 and a fundamental frequency of a surge voltage to be suppressed being f1, Expression (3) is satisfied, $$f1=1/[2\pi \times (Lb \times C0)^{1/2}] \quad \text{Expression (3)}.$$

[4] A noise-reducing shielded cable comprising a cable (20) that connects an inverter (10) and a motor (30) with each other, a shield layer (40) covering the cable, and a ground wire that grounds one end of the shield layer, wherein a ground wire (51) of self-inductance Lc is used as the ground wire, and wherein, with capacitance between a core wire of the cable and the shield layer being C0 and a fundamental frequency of a surge voltage to be suppressed being f1, Expression (4) is satisfied $$f1=1/[2\pi \times (Lc \times C0)^{1/2}] \qquad \text{Expression (4).}$$

While the present invention has been described in detail and with reference to specific embodiments thereof, those skilled in the art will understand that various changes and modifications may be made therein without departing from the spirit and scope of the invention.

The present application is based on a Japanese Patent Application No. 2013-010471 filed on Jan. 23, 2013, the content of which is incorporated herein by reference.

INDUSTRIAL APPLICABILITY

According to a noise-reducing shielded cable of the present invention, it is possible to reduce the size, the mass and the cost of apparatus and to satisfactorily deal with noise passing through a GND plane without reducing efficiency. The invention having such an effect is useful for a noise-reducing shielded cable having a noise-reducing function for reducing switching noise or inductive load surge occurring due to switching operation of a switching circuit.

LIST OF REFERENCE SIGNS

10: inverter
20: cable
30: motor
40: shielded cable
50: ground wire
51: ground wire of self-inductance La3
Ca1,Ca2,Ca3: capacitor
La1,La2,La3,Lb: inductor

The invention claimed is:

1. A noise-reducing shielded cable comprising a cable that connects an inverter and a motor with each other, a shield layer covering the cable, a first ground wire that grounds one of both ends of the shield layer, and a second ground wire that grounds the other of the both ends of the shield layer,
  wherein a capacitor of capacitance Ca1 and an inductor of inductance La1 are provided on the first ground wire,
  wherein a capacitor of capacitance Ca2 and an inductor of inductance La2 are provided on the second ground wire, and
  wherein, with capacitance between a core wire of the cable and the shield layer being C0 and a fundamental frequency of a surge voltage to be suppressed being f1, Expression (1) is satisfied, $$f1=1/[2\pi \times (L \times C)^{1/2}] \qquad \text{Expression (1)}$$

wherein $L=La1$ and $C=C0 \times Ca1/(C0+Ca1)$ or $L=La2$ and $C=C0 \times Ca2/(C0+Ca2)$.

2. A noise-reducing shielded cable comprising a cable that connects an inverter and a motor with each other, a shield layer covering the cable, and a ground wire that grounds one end of the shield layer,
  wherein a capacitor of capacitance Ca3 and an inductor of inductance La3 are provided on the ground wire, and
  wherein, with capacitance between a core wire of the cable and the shield layer being C0 and a fundamental frequency of a surge voltage to be suppressed being f1, Expression (2) is satisfied, $$f1=1/[2\pi \times (L \times C)^{1/2}] \qquad \text{Expression (2)}$$

wherein $L=La3$ and $C=C0 \times Ca3/(C0+Ca3)$.

3. A noise-reducing shielded cable comprising a cable that connects an inverter and a motor with each other, a shield layer covering the cable, and a ground wire that grounds one end of the shield layer,
  wherein an inductor of inductance Lb is provided on the ground wire, and
  wherein, with capacitance between a core wire of the cable and the shield layer being C0 and a fundamental frequency of a surge voltage to be suppressed being f1, Expression (3) is satisfied, $$f1=1/[2\pi \times (Lb \times C0)^{1/2}] \qquad \text{Expression (3).}$$

4. A noise-reducing shielded cable comprising a cable that connects an inverter and a motor with each other, a shield layer covering the cable, and a ground wire that grounds one end of the shield layer,
  wherein a ground wire of self-inductance Lc is used as the ground wire, and
  wherein, with capacitance between a core wire of the cable and the shield layer being C0 and a fundamental frequency of a surge voltage to be suppressed being f1, Expression (4) is satisfied, $$f1=1/[2\pi \times (Lc \times C0)^{1/2}] \qquad \text{Expression (4).}$$

* * * * *